(12) United States Patent
Huang

(10) Patent No.: US 11,733,572 B2
(45) Date of Patent: *Aug. 22, 2023

(54) IMAGE CAPTURING APPARATUS

(71) Applicant: Shanghai Harvest Intelligence Technology Co., Ltd., Shanghai (CN)

(72) Inventor: Jiandong Huang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/850,911

(22) Filed: Jun. 27, 2022

(65) Prior Publication Data

US 2022/0326560 A1 Oct. 13, 2022

Related U.S. Application Data

(63) Continuation of application No. 17/071,638, filed on Oct. 15, 2020, now Pat. No. 11,402,708.

(30) Foreign Application Priority Data

Oct. 18, 2019 (CN) .......................... 201910994582.2

(51) Int. Cl.
*G02F 1/1333* (2006.01)
*G02F 1/1335* (2006.01)
(Continued)

(52) U.S. Cl.
CPC ........ *G02F 1/13476* (2013.01); *G02F 1/1334* (2013.01); *G06V 40/1318* (2022.01);
(Continued)

(58) Field of Classification Search
CPC ............. G02F 1/1333; G02F 1/133331; G02F 1/13338; G02F 1/1334; G02F 1/13345;
(Continued)

(56) References Cited

U.S. PATENT DOCUMENTS 10,620,745 B2 4/2020 He et al.
10,922,398 B2 2/2021 He et al.
(Continued)

FOREIGN PATENT DOCUMENTS

CN 101283308 A 10/2008
CN 109154959 A 1/2019
(Continued)

OTHER PUBLICATIONS

First Chinese Office Action regarding Application No. 201910994582.2 dated Mar. 3, 2022. English translation provided by Unitalen Attorneys at Law.

*Primary Examiner* — Thoi V Duong
(74) *Attorney, Agent, or Firm* — Harness, Dickey & Pierce, P.L.C.

(57) ABSTRACT

The present disclosure provides an image capturing apparatus, including: a light source module configured to emit an incident light, wherein the light source module has a first surface and a second surface opposite to each other; an LCD module having a first surface and a second surface opposite to each other, wherein the second surface of LCD module faces the first surface of light source module, an air gap is formed between LCD module and light source module, and LCD module comprises a scattering layer for scattering the incident light; a light-transmitting cover plate having a first surface and a second surface, wherein first surface of the light-transmitting cover plate is configured to contact with an object to be captured, and second surface of the light-transmitting cover plate faces first surface of LCD module; and a sensor module configured to collect incident light reflected by light-transmitting cover plate.

14 Claims, 6 Drawing Sheets

(51) Int. Cl.
  *G02F 1/1347* (2006.01)
  *H01L 27/146* (2006.01)
  *G02F 1/1334* (2006.01)
  *G06V 40/13* (2022.01)
  *F21V 8/00* (2006.01)
  *G02F 1/13357* (2006.01)

(52) U.S. Cl.
  CPC ...... *H01L 27/14625* (2013.01); *G02B 6/0001* (2013.01); *G02F 1/1336* (2013.01); *G02F 1/13345* (2021.01); *G02F 1/133331* (2021.01); *G02F 1/133504* (2013.01); *G02F 1/133528* (2013.01); *G02F 2201/17* (2013.01); *H01L 27/14678* (2013.01)

(58) Field of Classification Search
  CPC ............. G02F 1/1335; G02F 1/133504; G02F 1/133514; G02F 1/133528; G02F 1/1336; G02F 1/133607; G02F 1/133615; G02F 1/13476; G02F 2201/17; G06V 40/1318; G02B 6/0001; H01L 27/14625; H01L 27/14678
  See application file for complete search history.

(56) References Cited

U.S. PATENT DOCUMENTS

| | | |
|---|---|---|
| 11,126,034 B2 | 9/2021 | Jiang |
| 11,402,708 B2* | 8/2022 | Huang ............... G06V 40/1318 |
| 2008/0252832 A1 | 10/2008 | Nieuwkerk et al. |
| 2019/0034020 A1 | 1/2019 | He et al. |
| 2019/0113670 A1* | 4/2019 | Mackey ............. G06V 40/1318 |
| 2020/0057340 A1 | 2/2020 | Jiang |
| 2020/0218392 A1 | 7/2020 | He et al. |
| 2020/0234024 A1 | 7/2020 | Qing et al. |
| 2021/0142026 A1 | 5/2021 | Ha et al. |

FOREIGN PATENT DOCUMENTS

| | | |
|---|---|---|
| CN | 109154961 A | 1/2019 |
| CN | 109313703 A | 2/2019 |
| CN | 109891432 A | 6/2019 |
| CN | 110244482 A | 9/2019 |
| EP | 3809326 A1 | 4/2021 |
| WO | WO-2007039863 A1 | 4/2007 |

* cited by examiner

IMAGE CAPTURING APPARATUS

CROSS-REFERENCE TO RELATED APPLICATIONS

The present application is a continuation application of U.S. application Ser. No. 17/071,638, which claims the benefit of priority to Chinese patent application No. 201910994582.2, filed on Oct. 18, 2019, entitled "Image Capturing Apparatus", the entire disclosures of which are incorporated herein by reference.

TECHNICAL FIELD

The present disclosure relates to the technical field of image capturing, and more particularly to an image capturing apparatus.

BACKGROUND

With the development of information technology, biometric technology plays an increasingly important role in ensuring information security, among which fingerprint identification has become one of the key technologies widely used in the field of mobile internet for identity recognition and device unlocking.

In the trend of larger and larger screen-to-body ratio of intelligent devices expected, a traditional capacitive fingerprint identification technology has been unable to meet the demand. However, ultrasonic fingerprint identification technology has problems in technology maturity and cost. Thus, an optical fingerprint identification technology is promising to become a mainstream technology scheme of fingerprint identification.

An existing optical fingerprint identification scheme is based on the imaging principle of geometric optical lens. Generally, a fingerprint module includes components such as a microlens array, an optical spatial filter and so on, which have many disadvantages such as complex structure, thick module, small sensing range and high cost, etc.

Compared with the existing optical fingerprint identification scheme, a non-lens optical under-screen fingerprint identification technology based on the total reflection imaging principle of physical optics has the advantages of simple structure, thin module, large sensing range and low cost, etc.

On the other hand, a display screen of an intelligent device mainly adopts a liquid crystal display (LCD) and an organic light emitting diode (OLED). An LCD screen has the advantages of low cost and easy manufacturing.

However, the existing fingerprint scheme under the LCD screen can only capture images based on ordinary reflection, and thus has poor imaging effect and low image clarity.

SUMMARY

Embodiments of the present disclosure provide an image capturing apparatus, in order to realize image capturing based on the principle of total reflection under an LCD screen.

In some embodiments, the image capturing apparatus includes: a light source module configured to emit an incident light, wherein the light source module has a first surface and a second surface opposite to each other along a thickness direction; an LCD module having a first surface and a second surface opposite to each other along the thickness direction, wherein the second surface of the LCD module faces the first surface of the light source module, an air gap is formed between the LCD module and the light source module, and the LCD module includes a scattering layer for scattering the incident light; a light-transmitting cover plate having a first surface and a second surface opposite to each other along the thickness direction, wherein the first surface of the light-transmitting cover plate is configured to contact with an object to be captured, and the second surface of the light-transmitting cover plate faces the first surface of the LCD module; and a sensor module configured to collect the incident light reflected by the light-transmitting cover plate.

In some embodiments, at least a partial of the incident light emitted from the light source module transmits through the air gap, enters the LCD module, and is scattered by the scattering layer, the incident light scattered upward from the scattering layer with a predetermined incident angle when reaching an upper surface of the light-transmitting cover plate is totally reflected, the incident light that is totally reflected by the light-transmitting cover plate is captured by the sensor module, to realize an image capturing of the object to be captured, and the predetermined incident angle is equal to or larger than a critical angle at which a total reflection occurs at the upper surface of the light-transmitting cover plate.

In some embodiments, the LCD module includes multiple layers, and the scattering layer is disposed at a layer closer to the second surface of the LCD module than to the first surface of the LCD module.

In some embodiments, the LCD module includes an upper polarizer, a liquid crystal layer, and a lower polarizer sequentially along a first direction, and the first direction is from the first surface to the second surface of the LCD module; the scattering layer is disposed between the lower polarizer and the liquid crystal layer.

In some embodiments, the LCD module further includes a color filter, an upper light transmitting plate, and a lower light transmitting plate, the upper polarizer, the color filter, the upper light transmitting plate, the liquid crystal layer, the lower light transmitting plate and the lower polarizer are disposed sequentially along the first direction; and the scattering layer is disposed between the lower polarizer and the lower light transmitting plate.

In some embodiments, the lower light transmitting plate is integrated with TFT; the sensor module includes photo diodes, the photo diodes and the TFT are distributed on a surface of the lower light transmitting plate in parallel, or the photo diodes are disposed on the upper light transmitting plate and the photo diodes on the upper light transmitting plate and the TFT on the lower light transmitting plate are aligned in the thickness direction.

In some embodiments, the scattering layer is made of polymer network liquid crystal material, and the scattering layer is configured to scatter the incident light when a first voltage is applied to the scattering layer.

In some embodiments, the first voltage is determined depending on a thickness of the scattering layer.

In some embodiments, the sensor module is integrated into the LCD module.

In some embodiments, the LCD module further includes an upper polarizer, a color filter, an upper light transmitting plate, a liquid crystal layer, a lower light transmitting plate and a lower polarizer disposed sequentially along a first direction, where the first direction is from the first surface to the second surface of the LCD module; and the sensor module is integrated onto the upper light transmitting plate, the color filter or the lower light transmitting plate.

In some embodiments, the sensor module is disposed between the light-transmitting cover plate and the LCD module; or the sensor module is disposed between the LCD module and the light source module and in the air gap.

In some embodiments, in a plane perpendicular to the thickness direction, the sensor module is disposed outside an area surrounded by an edge of the LCD module, and the image capturing apparatus further includes a deflection component disposed in the air gap for deflecting the incident light reflected by the light-transmitting cover plate to the sensor module.

In some embodiments, the deflection component and the sensor module are located in a same plane perpendicular to the thickness direction; and/or the deflection component is a conical waveguide having a conical tip disposed in a direction away from the sensor module.

In some embodiments, the light source module includes: a display light source for providing illumination when the sensor module is in a non-working state, and a detection light source for providing illumination when the sensor module is in a working state; and/or display of the LCD module and sensing of the sensor module are executed in a time-sharing manner.

In some embodiments, the image capturing apparatus further includes an optical adhesive layer filled between the light-transmitting cover plate and the LCD module.

In some embodiments, when the sensor module is in a working state, a liquid crystal layer of the LCD module is applied with a second voltage, and a light path of the liquid crystal layer is controlled to be on to allow light to pass.

Compared with conventional technologies, embodiments of the present disclosure have following beneficial effects.

According to embodiments of the present disclosure, the image capturing apparatus includes a light source module configured to emit an incident light, wherein the light source module has a first surface and a second surface opposite to each other along a thickness direction; an LCD module having a first surface and a second surface opposite to each other along the thickness direction, wherein the second surface of the LCD module faces the first surface of the light source module, an air gap is formed between the LCD module and the light source module, and the LCD module includes a scattering layer for scattering the incident light; a light-transmitting cover plate having a first surface and a second surface opposite to each other along the thickness direction, wherein the first surface of the light-transmitting cover plate is configured to contact with an object to be captured, and the second surface of the light-transmitting cover plate faces the first surface of the LCD module; and a sensor module configured to collect the incident light reflected by the light-transmitting cover plate.

Compared with existing LCD image capturing apparatus, the embodiments of the present disclosure can realize image capturing based on the principle of total reflection for a device with an LCD screen, optimize the imaging effect, and improve the imaging clarity. Specifically, the scattering layer is added in the LCD module to scatter the incident light entering the LCD module, which creates a condition for total reflection when the incident light reaches the light-transmitting cover plate. In other words, with the embodiments of the present disclosure, even if the total reflection occurs when the incident light emitted by the light source module reaches the second surface of the LCD module due to the existence of the air gap, the incident light entering the LCD module may be scattered in the scattering layer, which is like shifting the light source to the position of the scattering layer, and a total reflection can occur "again" when the scattered light reaches the light-transmitting cover plate. Thus, capturing images based on the principle of total reflection can be realized. Therefore, by shifting backlight source upwards in a special way, the embodiments of the present disclosure can effectively eliminate the influence of the air gap between the LCD module and the light source module on the imaging result.

DETAILED DESCRIPTION

Figure 1:
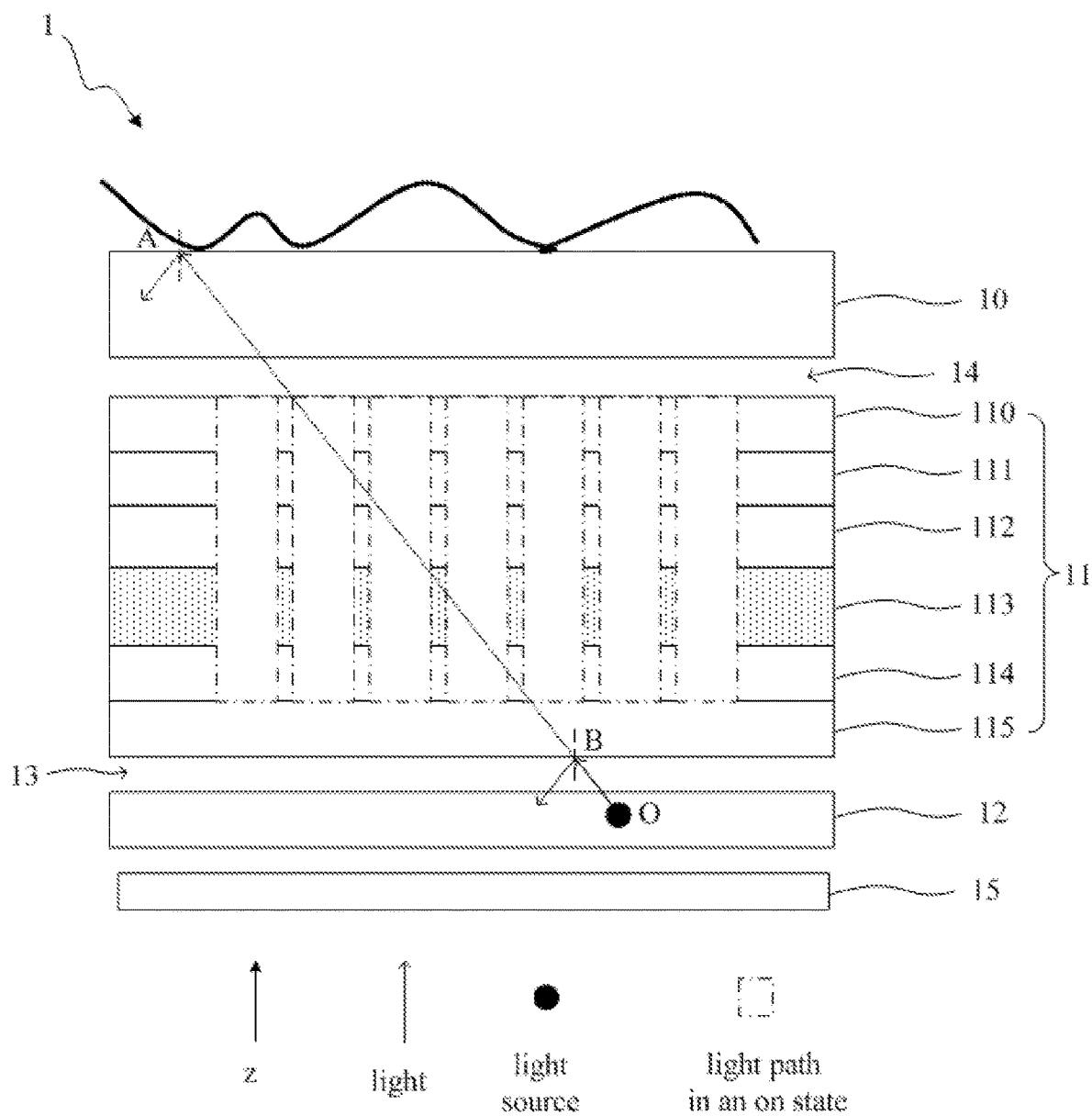
FIG. 1 is a schematic view of an image capturing apparatus including an LCD module.

As described in the background art, the existing fingerprint scheme under the LCD screen can only capture images based on ordinary reflection, and thus has poor imaging effect and low image clarity.

In order to solve this problem, the inventor researched an image capturing apparatus including an LCD module. Specifically, referring to FIG. 1, along a thickness direction (z direction shown in the figure), the image capturing apparatus 1 sequentially includes a light-transmitting cover plate 10, an LCD stack 11, a backlight module 12 and a sensor module 15 from top to bottom.

In z direction, the LCD stack 11 sequentially includes an upper polarizer 110, a color filter 111, an upper glass plate 112, a liquid crystal layer 113, a lower glass plate 114 and a lower polarizer 115 from top to bottom.

In FIG. 1, rectangular areas marked by dotted lines are light paths, and each light path corresponds to a pixel unit on the sensor module 15. Therefore, one light path can represent one LCD pixel.

The upper polarizer 110 and the lower polarizer 115 work together to cause the LCD pixel to be in an off state in which light is not allowed to pass through. If the light path is in an off state when the LCD fingerprint sensor 1 is powered off, light cannot pass through the LCD stack 11 to reach the light-transmitting cover plate 10.

The upper polarizer 110 and the lower polarizer 115 work together to cause the LCD pixel to be in an on state in which the light is allowed to pass through. As shown in FIG. 1, the light path is in an on state, and the light can pass through the LCD stack 11 to reach the light-transmitting cover plate 10 and is reflected by the light-transmitting cover plate 10, and then carry a fingerprint information of a finger placed on the other side of the light-transmitting cover plate 10 to the sensor module 15.

Further, an optical clear adhesive (OCA) layer 14 is filled between the light-transmitting cover plate 10 and the LCD stack 11.

Further, an air gap 13 is formed between the LCD stack 11 and the backlight module 12.

In practical application, the backlight module 12 may reuse a display panel of an intelligent device, and other components such as the light-transmitting cover plate 10 and the LCD stack 11 are integrated and packaged into a whole beforehand, and then assembled to an appropriate position on the display panel. Thus, the backlight module 12 and other parts of the image capturing apparatus 1 are separated from each other, and the air gap 13 is inevitably formed between the backlight module 12 and the image capturing apparatus 1.

Taking a light source O on the backlight module 12 as an example, if there is no air gap 13, the incident light emitted from the light source O can reach the light-transmitting cover plate 10 and be totally reflected at point A when the light path is in the on state. However, due to the existence of the air gap 13, a partial of the incident light emitted from the light source O is totally reflected when reaching the LCD stack 11, that is, at point B, and cannot actually reach the light-transmitting cover plate 10.

Therefore, due to the existence of the air gap 13, the partial of the incident light emitted from the backlight module 12 already undergoes a total reflection before entering the LCD stack 11, the LCD fingerprint sensor 1 cannot capture fingerprint images based on the principle of total reflection, and can only capture fingerprint images based on ordinary reflection. The imaging effect is poor, and the image clarity is low.

In order to solve above technical problem, embodiments of the present disclosure provide another image capturing apparatus. The image capturing apparatus includes: a light source module configured to emit an incident light, wherein the light source module has a first surface and a second surface opposite to each other along a thickness direction; an LCD module having a first surface and a second surface opposite to each other along the thickness direction, wherein the second surface of the LCD module faces the first surface of the light source module, an air gap is formed between the LCD module and the light source module, and the LCD module includes a scattering layer for scattering the incident light; a light-transmitting cover plate having a first surface and a second surface opposite to each other along the thickness direction, wherein the first surface of the light-transmitting cover plate is configured to contact with an object to be captured, and the second surface of the light-transmitting cover plate faces the first surface of the LCD module; and a sensor module configured to collect the incident light reflected by the light-transmitting cover plate.

The embodiments of the present disclosure can realize image capturing based on the principle of total reflection for a device with an LCD screen, optimize the imaging effect, and improve the imaging clarity. Specifically, the scattering layer is added in the LCD module to scatter the incident light entering the LCD module, which creates a condition for total reflection when the incident light reaches the light-transmitting cover plate. In other words, with the embodiments of the present disclosure, even if the total reflection occurs when the incident light emitted by the light source module reaches the second surface of the LCD module due to the existence of the air gap, the incident light entering the LCD module may be scattered in the scattering layer, which is like shifting the light source to the position of the scattering layer, and a total reflection can occur "again" when the scattered light reaches the light-transmitting cover plate. Thus, capturing images based on the principle of total reflection can be realized. Therefore, by shifting backlight source upwards in a special way, the embodiments of the present disclosure can effectively eliminate the influence of the air gap between the LCD module and the light source module on the imaging result.

Furthermore, the embodiments of the present disclosure can realize the total reflection of light while keeping the air gap, without changing the structure of the light source module or changing the combination mode of the light source module and the LCD module, thus requirements for the manufacturing process are low, and implementation cost is low.

Next, embodiments of the present disclosure will be described in detail with reference to the drawings. The same part is marked with the same reference numeral in each figure. Each embodiment is only an example, of course, the structure shown in different embodiments may be partially replaced or combined. In the variant example, the description of matters common to the first embodiment is omitted, and only different features are explained. In particular, the same effects produced by the same structure are not mentioned one by one according to each embodiment.

In order to make above purposes, features and beneficial effects of the present disclosure more obvious and understandable, specific embodiments of the present disclosure will be described in detail with the attached drawings.

Figure 2:
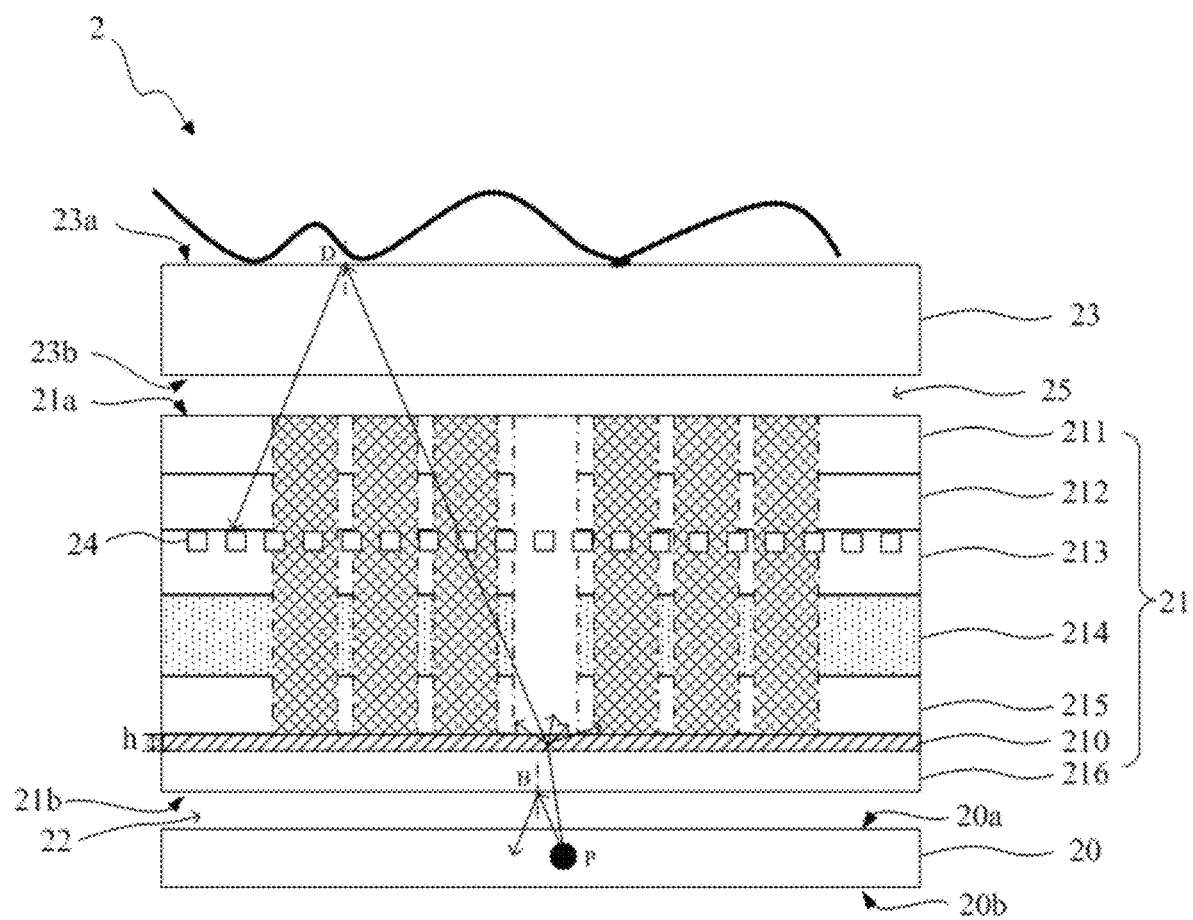
FIG. 2 is a schematic view of an image capturing apparatus according to an embodiment of the present disclosure.
Figure 2:
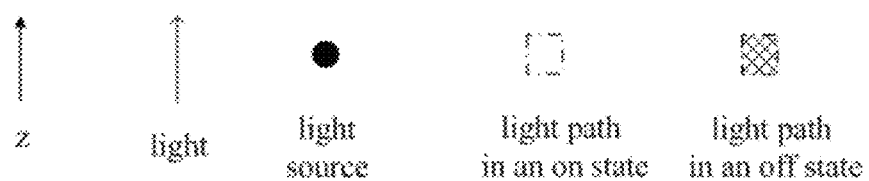

FIG. 2 is a schematic view of an image capturing apparatus 2 according to an embodiment of the present disclosure.

The image capturing apparatus 2 may be an optical under-screen image capturing apparatus, such as an optical under-screen fingerprint capturing apparatus based on the principle of optical total reflection.

The image capturing apparatus 2 can be adapted to capture an image of an object to be captured, the object to be captured may be a finger, and the image may be a fingerprint image.

Specifically, referring to FIG. 2, the image capturing apparatus 2 may include a light source module 20, an LCD module 21, a light-transmitting cover plate 23, and a sensor module 24. The light source module 20 is configured to emit an incident light and has a first surface 20a and a second surface 20b opposite to each other along a thickness direction (z direction). The LCD module 21 has a first surface 21a and a second surface 21b opposite to each other along the thickness direction (z direction), and the second surface 21b of the LCD module 21 faces the first surface 20a of the light source module 20. There is an air gap 22 between the LCD module 21 and the light source module 20. The LCD module 21 includes a scattering layer 210 for scattering the incident light. The light-transmitting cover plate 23 has a first surface 23a and a second surface 23b opposite to each other along the thickness direction (z direction), the first surface 23a of the light-transmitting cover plate 23 is configured to contact with an object to be captured, and the second surface 23b of the light-transmitting cover plate 23 faces the first surface 21a of the LCD module 21. The sensor module 24 is configured to collect the incident light reflected by the light-transmitting cover plate 23.

In some embodiments, the sensor module 24 may be a photoelectric sensor, and includes a plurality of pixels arranged in an array. For each pixel, the pixel includes a photo diode (PD), as indicated by rectangular blocks marked by reference numeral 24 in FIG. 2.

It should be noted that the position relationship between light paths and the pixels in the figure is only an example.

In practical applications, one light path may correspond to one pixel, or one light path may correspond to multiple pixels.

For example, still referring to FIG. 2, during image capturing, a voltage may be applied to a specific one or more pixels so that only the light path corresponding to the specific one or more pixels is in the on state, so as to capture local area images only.

In some embodiments, the voltage may be applied to the pixels sequentially in row or in column to turn on the light path and capture an overall image of the object to be captured.

In some embodiments, the light source module 20 may be a backlight module.

The first surface 20a of the light source module 20 and the second surface 21b of the LCD module 21 may not be in direct contact with each other, and a gap formed between the two surfaces is the air gap 22.

Or, although the first surface 20a of the light source module 20 is attached to the second surface 21b of the LCD module 21, due to technical limitations of the manufacturing process, there is still the air gap 22 between the first surface 20a of the light source module 20 and the second side 21b of the LCD module 21.

In some embodiments, the scattering layer 210 may be made of polymer network liquid crystal (PNLC) material, and the scattering layer 210 is configured to scatter the incident light under a predetermined condition.

Specifically, the main feature of the PNLC material is that the polymer is cured by different methods (such as light or heat), and then the cured polymer is used as a support to inject liquid crystal. Thus, by combining with spatial modulation of the polymer in the liquid state of liquid crystal and then adding the electric field of the electrode, different optical properties are formed.

Therefore, on the premise that there is the air gap 22 between the light source module 20 and the LCD module 21, through the different optical properties of the PNLC material under different conditions such as affecting the optical property by applying electric field.

In the scattering layer 210, the network liquid crystal is distributed in a three-dimensional mesh formed by the cured polymer to form a continuous channel network.

For example, a liquid crystal mixture may be injected into the three-dimensional mesh, and the liquid crystal mixture may include: a network liquid crystal; an anisotropic monomer, a photo initiator, a co-initiator or a mono acrylate monomer.

When the first voltage is not applied to the scattering layer 210, the scattering layer 210 is in a transparent or light-transmitting state, and the incident light can pass through directly, so the total reflection, that is, a wave guiding state, is retained.

When the first voltage is applied to the scattering layer 210, the scattering layer 210 is in an opaque state. Since liquid crystal molecules in the scattering layer 210 are deflected and form a local refractive index contrast difference with the cured polymer, the incident light can be scattered.

Thus, the scattering layer 210 can be equivalent to the light source module 20, which is equivalent to move the light source module 20 to be above the air gap 22. The embodiments of the present disclosure utilizes the scattering layer 210 to produce incident light with large angle to form total reflection light on the light-transmitting cover plate 23.

In a typical application scenario, still referring to FIG. 2, assume that the corresponding light path is in the on state, taking the light emitted from the light source P as an example, except for the light which has total reflection at point B of the second surface 21b of the LCD module 21, remaining incident light enter the LCD module 21. When the first voltage is applied to the scattering layer 210, the incident light is scattered in the scattering layer 210 when reaching the scattering layer 210, so that the light scattered upward from the scattering layer 210 can be totally reflected when reaching the light-transmitting cover plate 23, as shown by point D in the figure. The image formed by the total reflection through the light-transmitting cover plate 23 can be captured by the sensor module 24, so as to realize the image capturing based on the principle of total reflection.

In some embodiments, the first voltage may be determined depending on a thickness h of the scattering layer 210.

For example, the first voltage may be 10V to 40V.

For example, the first voltage may be directly proportional to the thickness h of the scattering layer 210.

In some embodiments, the LCD module 21 may further include an upper polarizer 211, a color filter 212, an upper light-transmitting plate 213, a liquid crystal layer 214, a lower light-transmitting plate 215, and a lower polarizer 216 disposed sequentially along a first direction, where the first direction is from the first surface 21a to the second surface 21b of the LCD module 21. The scattering layer 210 may be disposed between the lower polarizer 216 and the lower light-transmitting plate 215. For example, the upper light-transmitting plate 213 may be an upper glass plate, and the lower light-transmitting plate 215 may be a lower glass plate.

For example, the scattering layer 210 may be applied to a surface of the lower light-transmitting plate 215 facing the lower polarizer 216.

In some embodiments, the liquid crystal layer may be made of liquid crystal material, and the light path may be controlled to be on by applying a second voltage to the liquid crystal layer 214. When the second voltage is not applied to the liquid crystal layer 213, the light path is off.

For example, the first voltage may be no less than 45V, and the second voltage may be 10V to 20V. Moreover, when the first voltage is applied to the scattering layer 210, the second voltage is applied to the liquid crystal layer 214, so that the light passing through the light path is scattered light when the light path is on.

In some embodiments, the second voltage of the liquid crystal layer 214 may be applied by the sensor module 24. For example, in a local fingerprint acquisition scene, a voltage can be applied to a specific pixel, and the applied voltage can be transmitted to the liquid crystal layer 214 corresponding to the pixel, so that the light path corresponding to the pixel is on.

In some embodiments, by the cooperation of the upper polarizer 211 and the lower polarizer 216, all light paths in the LCD module 21 may be on or off at the same time.

In some embodiments, an optical adhesive layer 25 may be filled between the light-transmitting cover plate 23 and the LCD module 21. For example, the first surface 21a of the LCD module 21 may be adhered to the second surface 23b of the light-transmitting cover plate 23 by an optical adhesive layer 25. Specifically, the optical adhesive layer 25 may be transparent or light-transmitting.

In some embodiments, the sensor module 24 may be integrated into the LCD module 21.

For example, referring to FIG. 2, the sensor module 24 may be integrated onto the upper light-transmitting plate 213.

Specifically, the sensor module 24 may be integrated onto a side of the upper light-transmitting plate 213 facing the color filter 212.

In some embodiments, the sensor module 24 may be integrated onto a side of the color filter 212 facing the upper light-transmitting plate 213.

In some embodiments, the light source module 20 may be a display panel.

For example, the display panel may be selected from a liquid crystal display, an active matrix organic light emitting diode display, and a micro light emitting diode display.

In some embodiments, the light-transmitting cover plate 23 may be made of glass material.

Specifically, the light-transmitting cover plate 23 may be integrated with protection and touch functions.

When the image capturing apparatus 2 is used for optical under-screen fingerprint identification, the first surface 23a of the light-transmitting cover plate 23 can be used to contact fingerprints.

From above, the embodiments of the present disclosure can realize image capturing based on the principle of total reflection for a device with an LCD screen, optimize the imaging effect and improve the imaging clarity. Specifically, the scattering layer is added in the LCD module to scatter the incident light entering the LCD module, which creates a condition for total reflection when the incident light reaches the light-transmitting cover plate. In other words, with the embodiments of the present disclosure, even if the total reflection occurs when the incident light emitted by the light source module reaches the second surface of the LCD module due to the existence of the air gap, the incident light entering the LCD module may be scattered in the scattering layer, which is like shifting the light source to the position of the scattering layer, and a total reflection can occur "again" when the scattered light reaches the light-transmitting cover plate. Thus, capturing images based on the principle of total reflection can be realized. Therefore, by shifting backlight source upwards in a special way, the embodiments of the present disclosure can effectively eliminate the influence of the air gap between the LCD module and the light source module on the imaging result.

Figure 3:
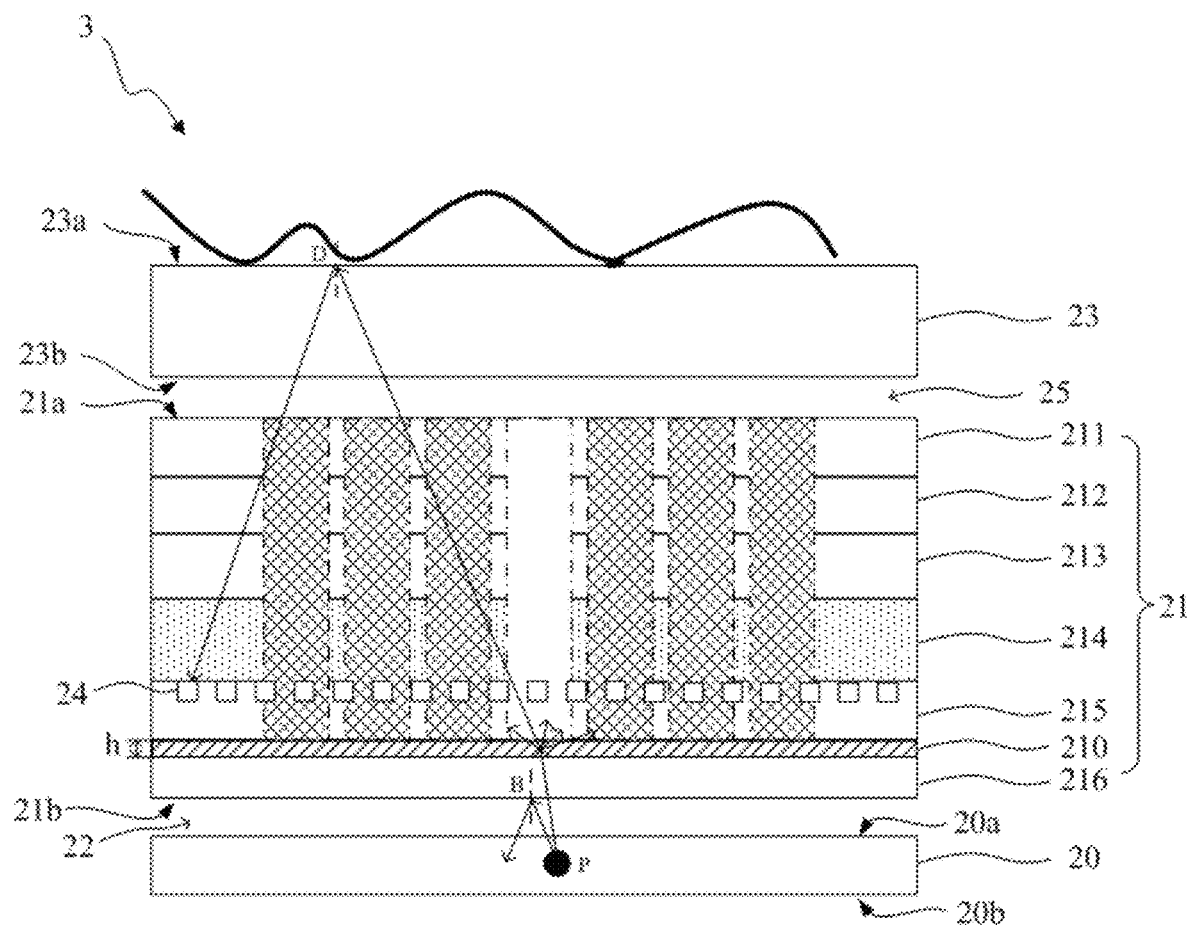
FIG. 3 is a schematic view of an image capturing apparatus according to another embodiment of the present disclosure.
Figure 3:
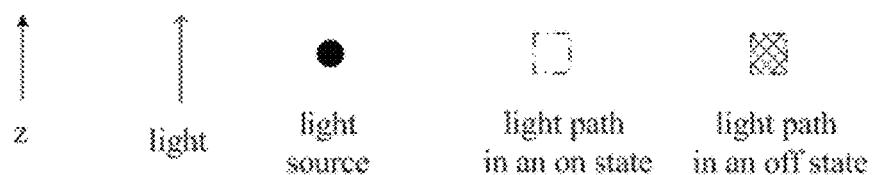

FIG. 3 is a schematic view of an image capturing apparatus 3 according to another embodiment of the present disclosure. Here, only the differences between the image capturing apparatus 3 and the image capturing apparatus 2 shown in FIG. 2 are mainly described.

In some embodiments, the main difference from the image capturing apparatus 2 shown in FIG. 2 is that the sensor module 24 may be integrated onto the lower light-transmitting plate 215.

For example, the sensor module 24 may be integrated onto a side of the lower light-transmitting plate 215 facing the liquid crystal layer 214.

In some embodiment, the lower light-transmitting plate 215 may be integrated with a thin film transistor (TFT). Further, the photo diodes and the TFT may be distributed on a surface of the lower light-transmitting plate 215 in parallel.

Compared with the image capturing apparatus 3 shown in FIG. 3, in the image capturing apparatus 2 shown in FIG. 2, the sensor module 24 disposed on the upper light-transmitting plate 213 has a higher light transmission rate, which is conducive to obtaining a clear image. Specifically, the closer the sensor module 24 is to the light-transmitting cover plate 23, the shorter the return distance of the total reflection light carrying fingerprint information, so that the light absorption efficiency is higher.

On the other hand, since the photo diodes take up areas, when the sensor module 24 is disposed on the upper light-transmitting plate 213, the photo diodes on the upper light-transmitting plate 213 and the TFT on the lower light-transmitting plate 215 can be aligned in the thickness direction, thereby increasing light transmittance.

Compared with the image capturing apparatus 2 shown in FIG. 2, the image capturing apparatus 3 shown in FIG. 3 is easier to implement in the manufacturing process, and has low manufacturing process complexity.

Figure 4:
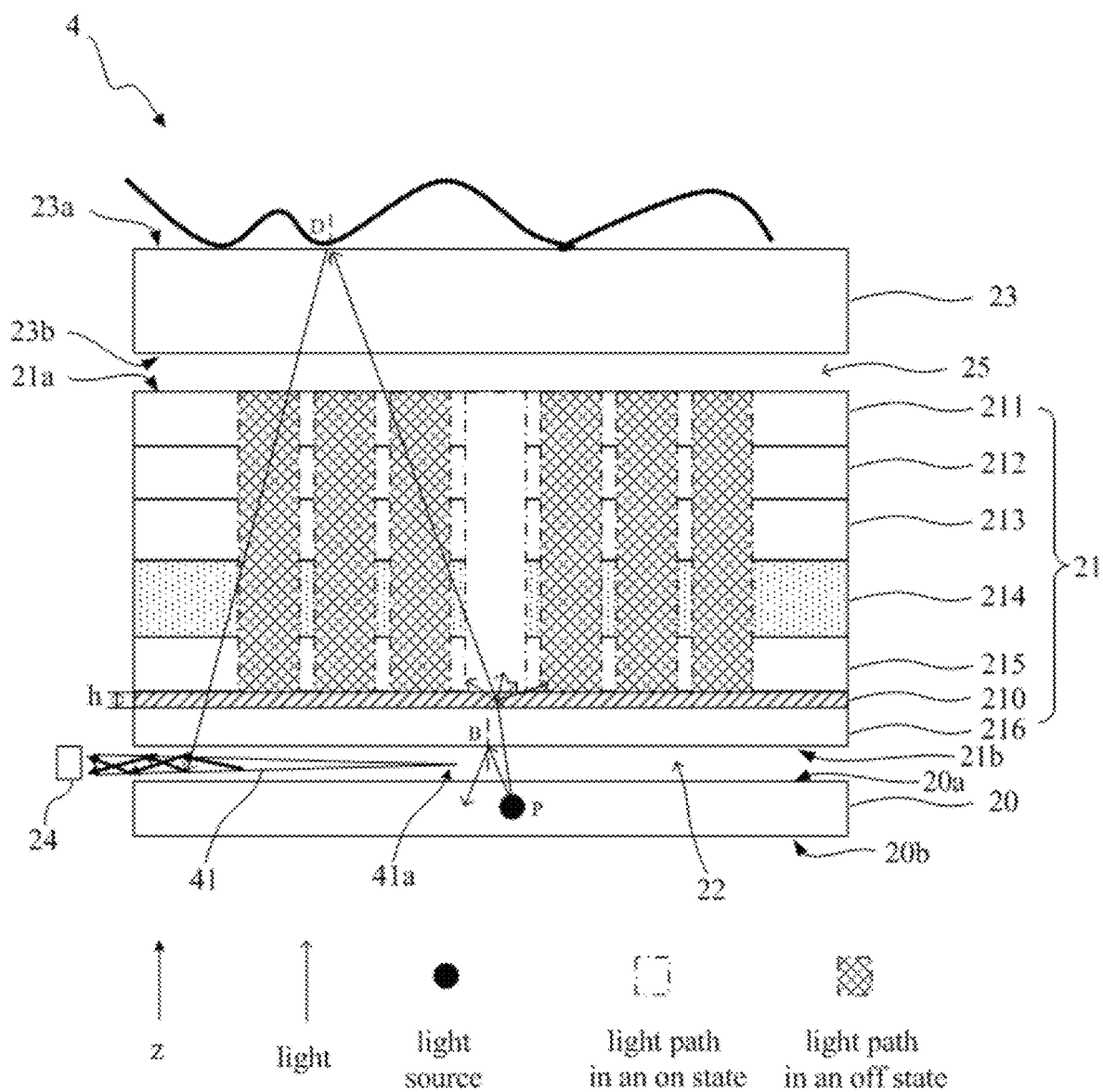
FIG. 4 is a schematic view of an image capturing apparatus according to another embodiment of the present disclosure.

FIG. 4 is a schematic view of an image capturing apparatus 4 according to another embodiment of the present disclosure. Here, only the differences between the image capturing apparatus 4 and the image capturing apparatus 2 shown in FIG. 2 are mainly described.

In some embodiments, the main difference between image capturing apparatus 4 and the image capturing apparatus 2 shown in FIG. 2 is that, in a plane perpendicular to the thickness direction (z direction), the sensor module 24 may be disposed outside an area surrounded by an edge of the LCD module 21.

For example, at the angle shown in FIG. 4, the sensor module 24 may be disposed on a left or right side of the LCD module 21. That is to say, the sensor module 24 and the LCD module 21 may be two independent components.

Specifically, the sensor module 24 can be disposed close to the air gap 22.

Further, the image capturing apparatus 4 may also include a deflection component 41 disposed in the air gap 22, and the deflection component 41 is used to deflect the incident light reflected by the light-transmitting cover plate 23 to the sensor module 24.

In some embodiments, the deflection member 41 and the sensor module 23 are located in a same plane perpendicular to the thickness direction (z direction).

For example, the deflection component 41 may be a conical waveguide, and a conical tip 41a of the conical waveguide is disposed in a direction away from the sensor module 24.

In some embodiments, the light source module 20 in embodiments of the present disclosure may also include: a display light source (not shown in the figure) for providing illumination when the sensor module 24 is in a non-working state; and a detection light source (not shown in the figure) for providing illumination when the sensor module 24 is in a working state.

Specifically, the detection light source may be infrared illumination light.

Further, the light source module 20 may also include a light guide plate (not shown in the figure).

In a typical application scenario, during a display state period, the light guide plate is transparent, the display light source provides illumination, and the user can see the image displayed by the light source module 20 from the first surface 23a of the light-transmission cover plate 23.

During a detection state period, the display light source is turned off, the detection light source is turned on, all light paths in the LCD module 21 are on, and the detection light of point P is totally reflected at point D after being scattered by the scattering layer 210, and then deflected to the outside sensor module 24 when returning to the conical waveguide 41 to form the image of the object to be captured.

Therefore, the sensor module 24 is disposed outside, and the deflection of the total reflection light is achieved by the deflection component 41, thus the total reflection light can be captured without changing other processes of the LCD module except for the scattering layer 210, which is conducive to reducing the manufacturing process complexity.

Figure 5:
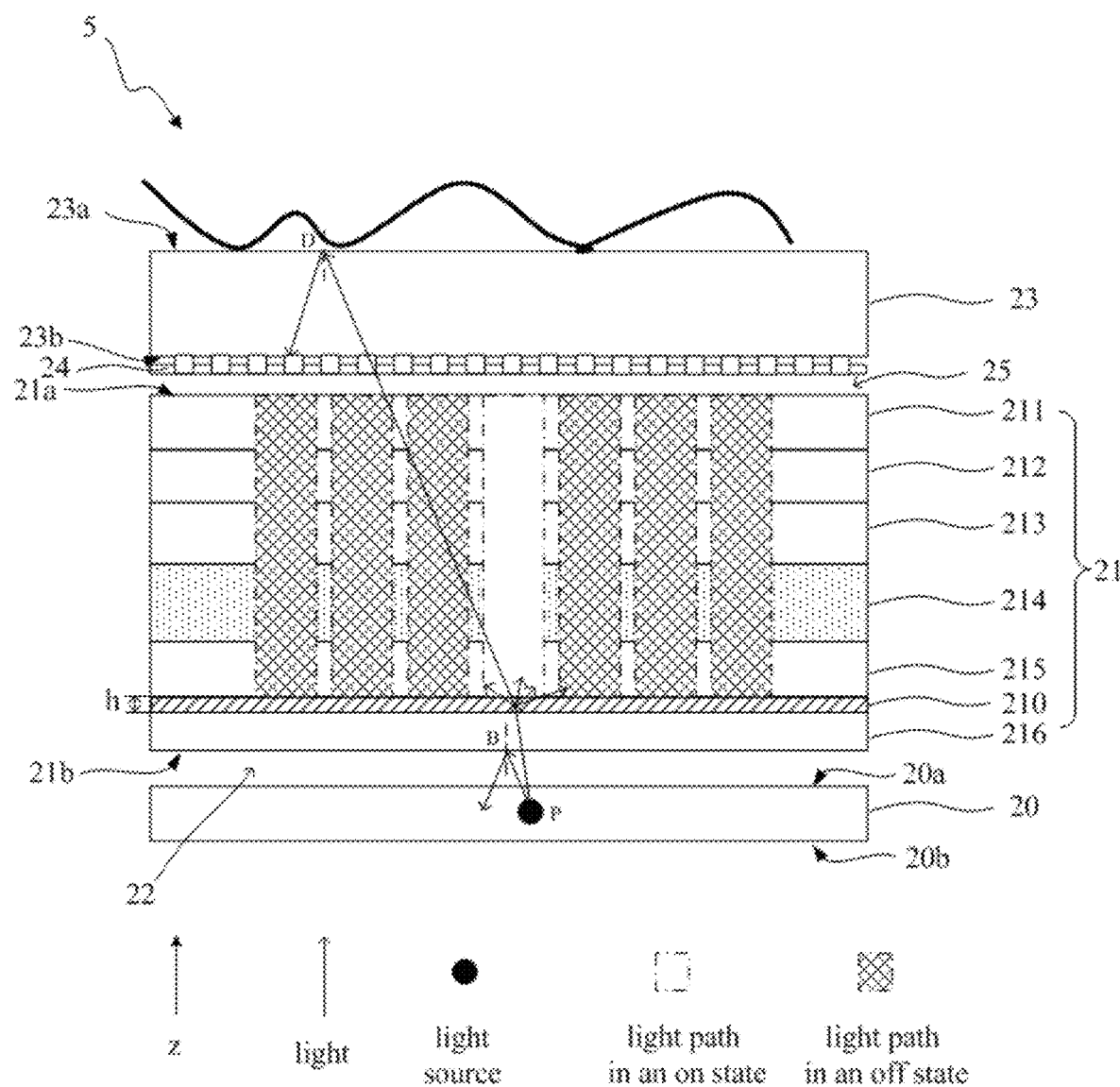
FIG. 5 is a schematic view of an image capturing apparatus according to another embodiment of the present disclosure.

FIG. 5 is a schematic view of an image capturing apparatus 5 according to another embodiment of the present disclosure. Here, only the differences between the image capturing apparatus 5 and the image capturing apparatus 2 shown in FIG. 2 are described.

In some embodiments, the main difference between the image capturing apparatus 5 and the image capturing apparatus 2 is that the sensor module 24 may be disposed between the light-transmitting cover plate 23 and the LCD module 21.

For example, the sensor module 24 may be disposed between the second surface 23b of the light-transmitting cover plate 23 and the first surface 21a of the LCD module 21, and other gaps between the light-transmitting cover plate 23 and the LCD module 21 may still be filled with optical adhesive layer 25.

In some embodiments, the sensor module 24 may be disposed close to the second surface 23b of the light-transmitting cover plate 23 to obtain a higher light transmittance.

Alternatively, the sensor module 24 may also be disposed close to the first surface 21a of the LCD module 21.

In some embodiments, the sensor module 24 may be made of transparent or light-transmitting material to avoid affecting the image display effect of the display panel at a non-image capturing stage.

In some embodiments, display and sensing may be executed in a time-sharing manner. That is to say, during image display, the sensor module 24 is not applied with voltage, and the image of the light source module 20 can be displayed outwards through the light-transmitting cover plate 23 without being blocked by the sensor module 24; and during image capturing, the sensor module 24 is applied with voltage to obtain the image of the object to be captured.

Thus, the sensor module 24 is disposed externally, and the total reflection light can be captured without changing other processes of the LCD module 21, except for the scattering layer 210, which is conducive to reducing the manufacturing process complexity.

Figure 6:
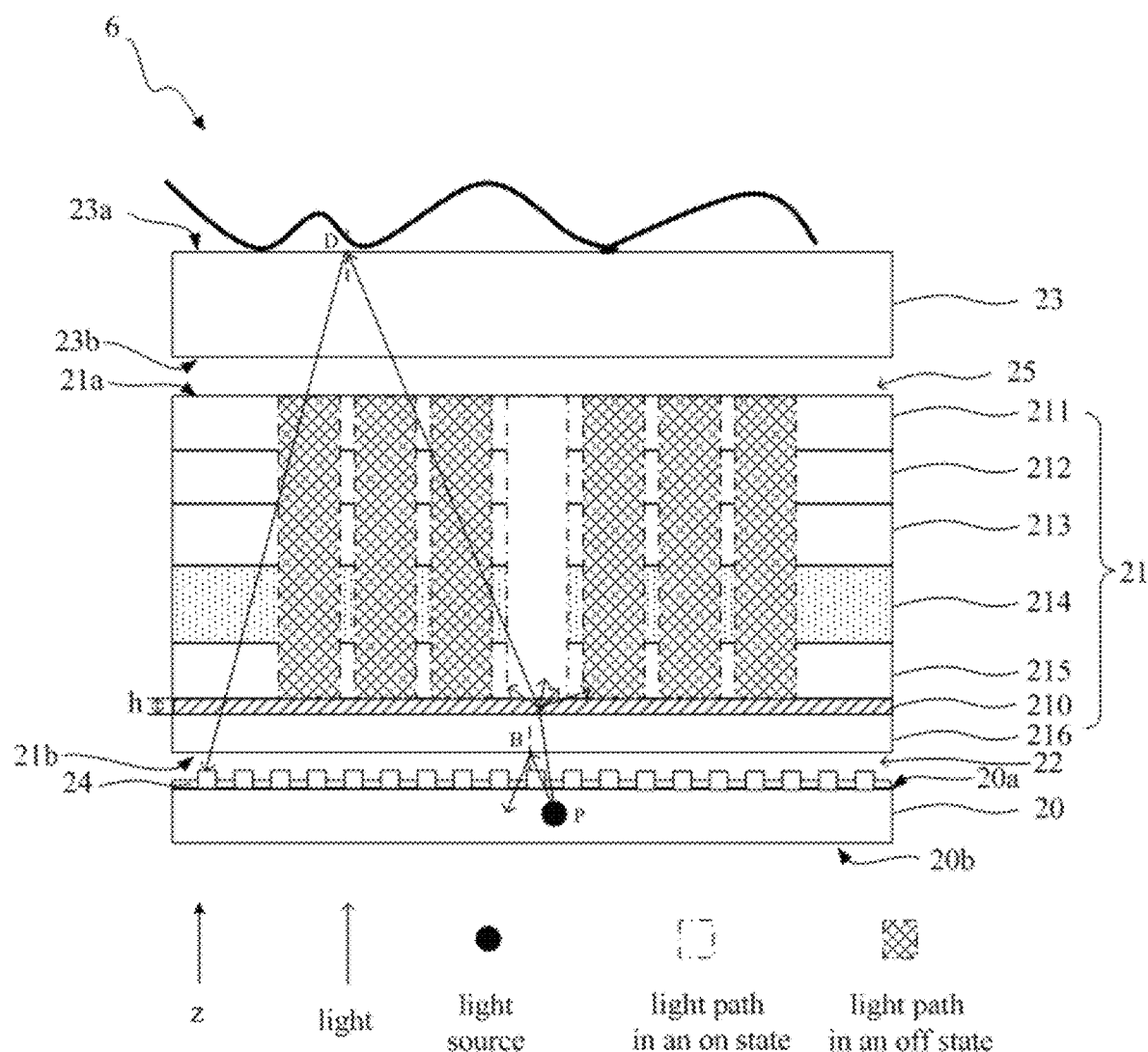
FIG. 6 is a schematic view of an image capturing apparatus according to another embodiment of the present disclosure.

FIG. 6 is a schematic view of an image capturing apparatus 6 according to another embodiment of the present disclosure. Here, only the differences between the image capturing apparatus 6 and the capturing apparatus 2 shown in FIG. 2 are described.

In some embodiments, the main difference between the image capturing apparatus 6 and the image capturing apparatus 2 is that the sensor module 24 may be disposed between the LCD module 21 and the light source module 20 and in the air gap 22.

That is, the sensor module 24 can be disposed in the air gap 22 to make full use of the space of the existing LCD fingerprint acquisition device.

For example, the sensor module 24 may be disposed close to the first surface 20a of the light source module 20.

Thus, the sensor module 24 is disposed externally, and the total reflection light can be captured without changing other processes of the LCD module 21, except for the scattering layer 210, which is conducive to reducing the manufacturing process complexity.

The image capturing apparatus 2 to the image capturing apparatus 6 according to the embodiments of the present disclosure can be applied to electronic devices such as mobile phones, smart bracelets, wristwatches, etc.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. An image capturing apparatus, comprising:
    a light source module configured to emit an incident light, wherein the light source module has a first surface and a second surface opposite to each other along a thickness direction;
    an LCD module having a first surface and a second surface opposite to each other along the thickness direction, wherein the second surface of the LCD module faces the first surface of the light source module, an air gap is formed between the LCD module and the light source module, and the LCD module comprises a scattering layer for scattering the incident light;
    a light-transmitting cover plate having a first surface and a second surface opposite to each other along the thickness direction, wherein the first surface of the light-transmitting cover plate is configured to contact with an object to be captured, and the second surface of the light-transmitting cover plate faces the first surface of the LCD module; and
    a sensor module configured to collect the incident light reflected by the light-transmitting cover plate,
    wherein the LCD module comprises multiple layers, and the scattering layer is disposed at a layer closer to the second surface of the LCD module than to the first surface of the LCD module;
    the LCD module comprises an upper polarizer, a liquid crystal layer, and a lower polarizer sequentially along a first direction, and the first direction is from the first surface to the second surface of the LCD module; and
    the scattering layer is disposed between the lower polarizer and the liquid crystal layer.

2. The image capturing apparatus according to claim 1, wherein at least a partial of the incident light emitted from the light source module transmits through the air gap, enters the LCD module, and is scattered by the scattering layer, the incident light scattered upward from the scattering layer with a predetermined incident angle when reaching an upper surface of the light-transmitting cover plate is totally reflected, the incident light that is totally reflected by the light-transmitting cover plate is captured by the sensor module, to realize an image capturing of the object to be captured, and the predetermined incident angle is equal to or larger than a critical angle at which a total reflection occurs at the upper surface of the light-transmitting cover plate.

3. The image capturing apparatus according to claim 1, wherein the LCD module further comprises a color filter, an upper light transmitting plate, and a lower light transmitting plate, the upper polarizer, the color filter, the upper light transmitting plate, the liquid crystal layer, the lower light transmitting plate and the lower polarizer are disposed sequentially along the first direction; and
    the scattering layer is disposed between the lower polarizer and the lower light transmitting plate.

4. The image capturing apparatus according to claim 3, wherein the lower light transmitting plate is integrated with TFT;
    the sensor module comprises photo diodes, the photo diodes and the TFT are distributed on a surface of the lower light transmitting plate in parallel, or the photo diodes are disposed on the upper light transmitting plate and the photo diodes on the upper light transmitting plate and the TFT on the lower light transmitting plate are aligned in the thickness direction.

5. The image capturing apparatus according to claim 3, wherein the sensor module is integrated into the LCD module.

6. The image capturing apparatus according to claim 5, wherein
the sensor module is integrated onto the upper light transmitting plate, the color filter or the lower light transmitting plate.

7. The image capturing apparatus according to claim 1, wherein the scattering layer is made of polymer network liquid crystal material, and the scattering layer is configured to scatter the incident light when a first voltage is applied to the scattering layer.

8. The image capturing apparatus according to claim 7, wherein the first voltage is determined depending on a thickness of the scattering layer.

9. The image capturing apparatus according to claim 1, wherein the sensor module is disposed between the light-transmitting cover plate and the LCD module; or the sensor module is disposed between the LCD module and the light source module and in the air gap.

10. The image capturing apparatus according to claim 1, wherein in a plane perpendicular to the thickness direction, the sensor module is disposed outside an area surrounded by an edge of the LCD module, and the image capturing apparatus further comprises a deflection component disposed in the air gap for deflecting the incident light reflected by the light-transmitting cover plate to the sensor module.

11. The image capturing apparatus according to claim 10, wherein the deflection component and the sensor module are located in a same plane perpendicular to the thickness direction; or
the deflection component is a conical waveguide having a conical tip disposed in a direction away from the sensor module.

12. The image capturing apparatus according to claim 1, wherein the light source module comprises:
a display light source for providing illumination when the sensor module is in a non-working state, and a detection light source for providing illumination when the sensor module is in a working state; or
display of the LCD module and sensing of the sensor module are executed in a time-sharing manner.

13. The image capturing apparatus according to claim 1, further comprising an optical adhesive layer filled between the light-transmitting cover plate and the LCD module.

14. The image capturing apparatus according to claim 1, when the sensor module is in a working state, a liquid crystal layer of the LCD module is applied with a second voltage, and a light path of the liquid crystal layer is controlled to be on to allow light to pass.

* * * * *